(12) United States Patent
Williams et al.

(10) Patent No.: US 7,242,199 B2
(45) Date of Patent: Jul. 10, 2007

(54) ACTIVE INTERCONNECTS AND CONTROL POINTS IN INTEGRATED CIRCUITS

(75) Inventors: R. Stanley Williams, Portola Valley, CA (US); Philip J Kuekes, Menlo Park, CA (US); Frederick A. Perner, Santa Barbara, CA (US); Greg Snider, Mountain View, CA (US); Duncan Stewart, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 89 days.

(21) Appl. No.: 11/112,795

(22) Filed: Apr. 21, 2005

(65) Prior Publication Data

US 2006/0238217 A1    Oct. 26, 2006

(51) Int. Cl.
*G01R 27/08*    (2006.01)
(52) U.S. Cl. ....................... 324/713; 324/761
(58) Field of Classification Search ............... None
See application file for complete search history.

(56) References Cited

U.S. PATENT DOCUMENTS 1,913,693 A * 6/1933 Wheeler ............... 333/177
6,407,627 B1 * 6/2002 Martin ................ 327/552
2003/0218514 A1 * 11/2003 Eckl et al. .............. 333/32

* cited by examiner

*Primary Examiner*—Vincent Q. Nguyen

(57) ABSTRACT

In various embodiments of the present invention, tunable resistors are introduced at the interconnect layer of integrated circuits in order to provide a for adjusting internal voltage and/or current levels within the integrated circuit to repair defective components or to configure the integrated circuit following manufacture. For example, when certain internal components, such as transistors, do not have specified electronic characteristics due to manufacturing defects, adjustment of the variable resistances of the tunable resistors included in the interconnect layer of integrated circuits according to embodiments of the present invention can be used to adjust internal voltage and/or levels in order to ameliorate the defective components. In other cases, the tunable resistors may be used as switches to configure integrated circuit components, including individual transistors and logic gates as well as larger, hierarchically structured functional modules and domains.

11 Claims, 12 Drawing Sheets

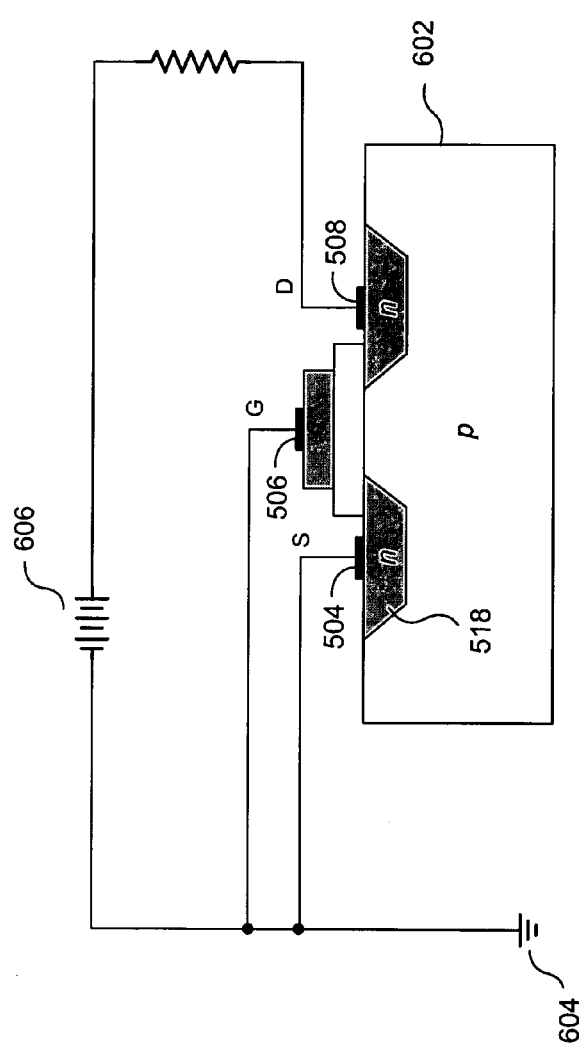
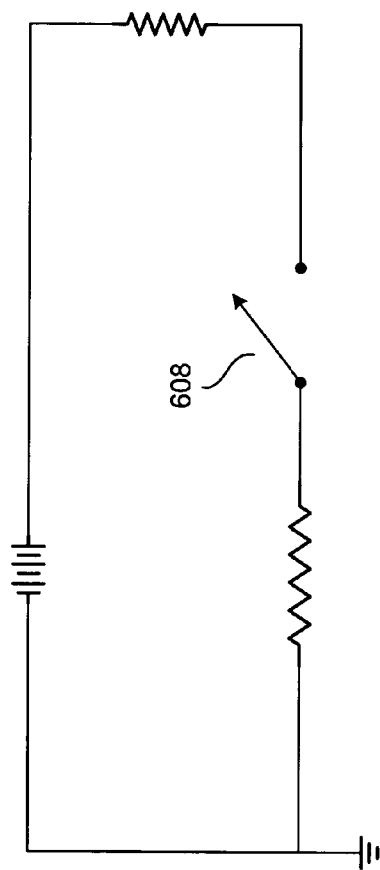
Figure 6A
Figure 6B

ACTIVE INTERCONNECTS AND CONTROL POINTS IN INTEGRATED CIRCUITS

STATEMENT OF GOVERNMENT INTEREST

This invention has been made with Government support under Agreement #MDA972-01-3-005, awarded by DARPA Moletronics. The government has certain rights in the invention.

TECHNICAL FIELD

The present invention is related to integrated circuits and, in particular, to an enhancement to integrated circuits that provides tunable control points and switches for modifying integrated-circuit functionality following manufacture.

BACKGROUND OF THE INVENTION

Integrated circuits are used in a wide variety of electronic devices and consumer products, from computers and computer peripherals to automobiles, electronic games, toys, machine tools, medical and scientific instruments, and other products and devices. Integrated circuits are essentially extremely complex and highly miniaturized electronic circuits. Modern integrated circuits routinely including millions of transistors that implement complex logic circuits to provide processor and memory devices with complex interfaces and functional behavior.

In general, integrated circuits are manufactured in high volumes by extremely expensive and technically demanding fabrication processes. In many ways, integrated circuits fabrication is one of the first, and by far most commercially successful, applications of nanotechnology. The smallest features of currently available integrated circuits have widths between 100 and 200 nanometers. Integrated circuits are commonly fabricated using photolithographic techniques that focus light through images of circuit patterns onto chemically prepared substrates in order to reduce the microscopic-scale images down to the submicroscopic patterns from which features of integrated circuits are constructed, layer by layer. Each step in the integrated circuit fabrication process involves careful deposition of metallic films, dopants, and photoresist, mechanical planarization, application of reactive etchants, rinsing with solvents, and other operations. Each photolithographic step requires careful alignment of a current photolithography mask with the features constructed in previous photolithography steps. Because of the complexity of the integrated circuit manufacturing process, and the small dimensions of integrated circuit features, extreme measures are taken to prevent contamination of nascent integrated circuits, and the fabrication environments in which they are manufactured, by dust, chemical contaminants, and other environmental interferences. However, despite these measures, and despite the high tolerances and extreme precision of integrated circuit manufacturing tools and procedures, a relatively large proportion of finished integrated circuits are subsequently found, during post-manufacturing testing, to be defective. As a result, relatively large proportions of the integrated circuits produced in an integrated circuit fabrication facility are unusable for their intended applications, and discarded. Each discarded, defective integrated circuit represents the loss of significant amounts of energy and highly purified chemical components, as well as the loss of significant amounts of time and, ultimately, money. For this reason, manufacturers of integrated circuits, as well as integrated circuit vendors and those who purchase and use products containing integrated circuits, have all recognized the need for decreasing the rate of defective integrated circuits, or, in other words, increasing the yield of functional integrated circuits, and, by doing so, decreasing the cost of integrated circuits.

SUMMARY OF THE INVENTION

In various embodiments of the present invention, tunable resistors are introduced at the interconnect layer of integrated circuits in order to provide a means for adjusting internal voltage and/or current levels within the integrated circuit to repair defective components or to configure the integrated circuit following manufacture. For example, when certain internal components, such as transistors, do not have specified electronic characteristics due to manufacturing defects, adjustment of the variable resistances of the tunable resistors included in the interconnect layer of integrated circuits according to embodiments of the present invention can be used to adjust internal voltage and/or levels in order to ameliorate the defective components. In other cases, the tunable resistors may be used as switches to configure integrated circuit components, including individual transistors and logic gates as well as larger, hierarchically structured functional modules and domains. In some cases, components and modules may be turned off, while, in other cases, components and modules may be turned on. The tunable resistors represent one of numerous, different types of active, control components that may be introduced, as various embodiments of the present invention, into the interconnect layer of an integrated circuit in order to provide post-manufacturing defect amelioration and configurability.

BRIEF DESCRIPTION OF THE DRAWINGS

FIGS. 6A-7B illustrate operation of the MOSFET shown in FIG. 5.

DETAILED DESCRIPTION OF THE INVENTION

Various embodiments of the present invention provide tunable, electronic components at the interconnect level of an integrated circuit in order to provide a means for tuning and configuring the integrated circuit following manufacture. As discussed above, the integrated circuit manufacturing process is expensive and complex, with a lower yield for functional integrated circuits than desirable. Because of the small component sizes and the layered structure of integrated circuits, it is generally not currently possible to repair defective integrated circuits. Instead, they must be discarded. Moreover, current integrated circuits are relatively static, and cannot be dynamically reconfigured following manufacture. Configurable devices, such as programmable gate arrays, are far larger and less efficient than dedicated integrated circuits with specifically designed functionalities, such as microprocessors and memory devices. By providing a means for tuning and configurating integrated circuits following manufacture, certain classes of defective integrated circuits can be ameliorated, and families of related integrated circuits can be produced by configuring a parent, or base, type of integrated circuit following manufacture.

Figure 1:
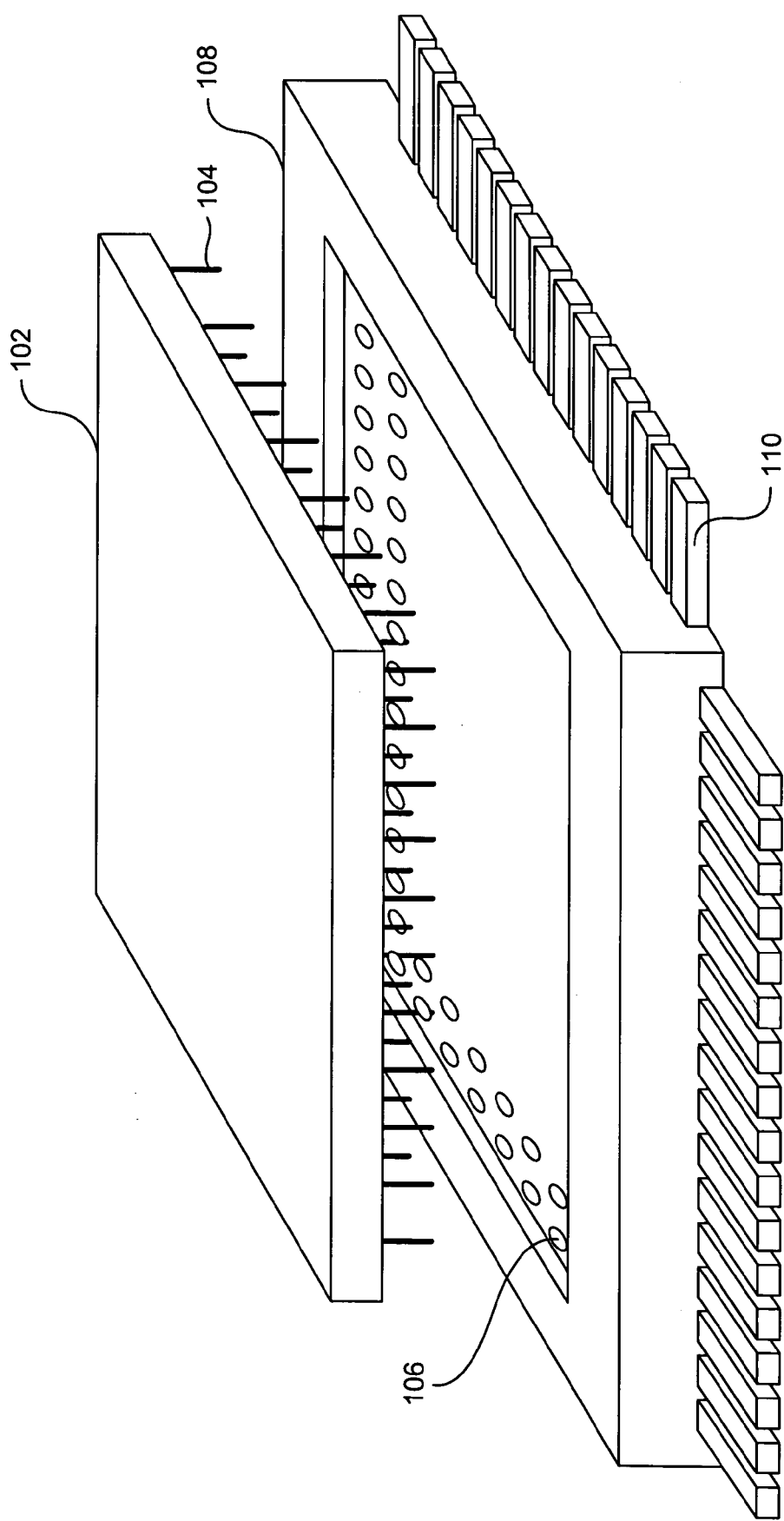
FIG. 1 illustrates the external characteristics of a generalized integrated circuit.

FIG. 1 illustrates the external characteristics of a generalized integrated circuit. In FIG. 1, the integrated circuit 102 includes a large number of electrical pins, such as pin 104, that are designed to mate with apertures, such as aperture 106, in a packaging component 108. The pattern of apertures in the packaging component 108 is designed to be complementary to the pattern of pins emanating from the base of the integrated circuit 102, so that the integrated circuit can be mechanically mated with the packaging component 108. The packaging component 108 includes contacts, signal lines, and simple circuitry that electronically interconnect the pins of the integrated circuit with conductive leads, such as conductive lead 110, fanning out from the base of the packaging component 108. The packaging component is normally mounted on a printed circuit board, with the leads interconnected with various signal lines leading to other electronic components.

Figure 2:
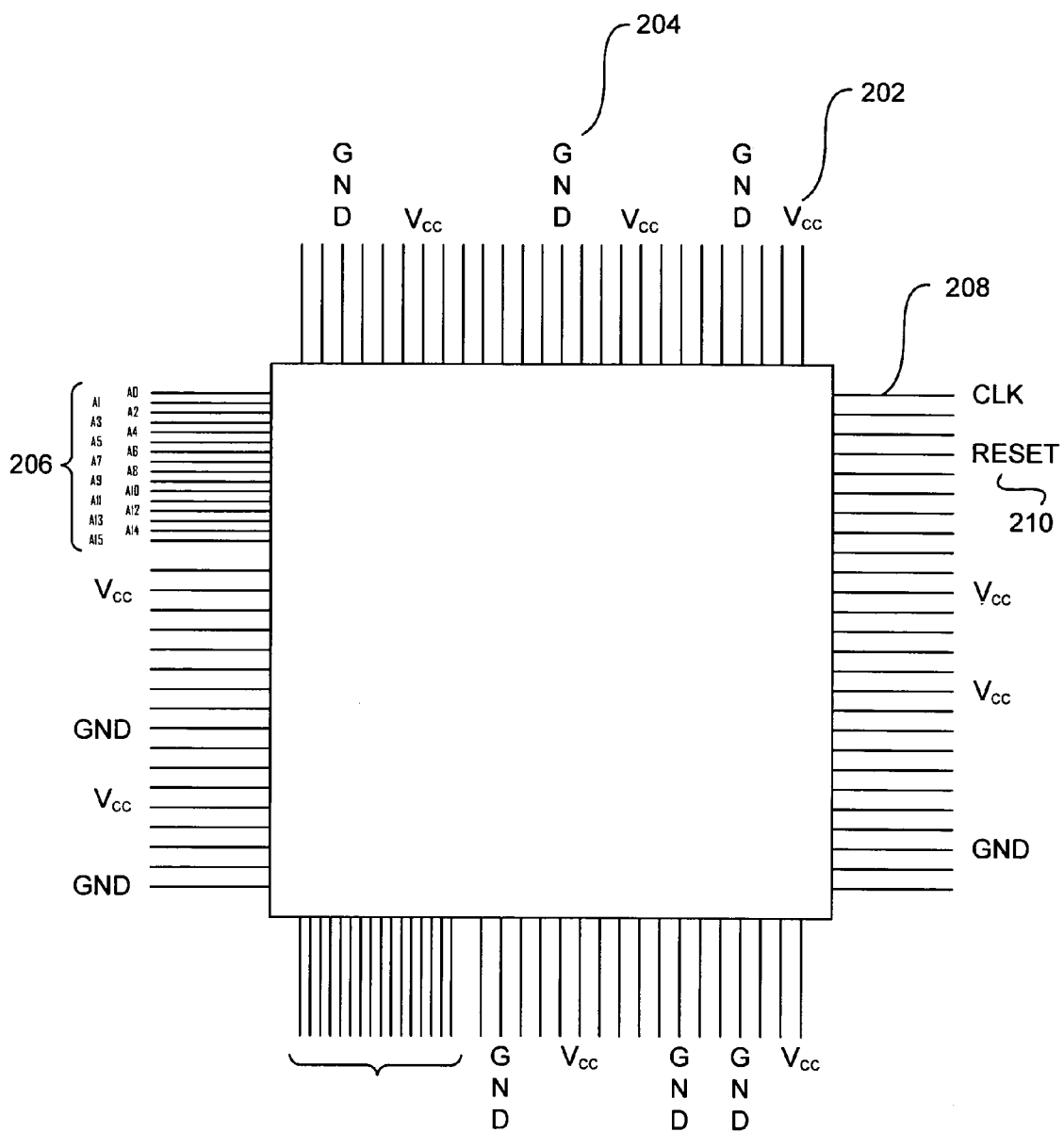
FIG. 2 shows an abstract view of an integrated circuit and packaging component as well as electronic leads for carrying signals into, and out from, the integrated circuit.

FIG. 2 shows an abstract view of an integrated circuit and packaging component as well as electronic leads for carrying signals into, and out from, the integrated circuit. FIG. 2 is intended to illustrate a generalized, abstract integrated-circuit interface, rather than a particular integrated circuit interface. Modern integrated circuits, such as microprocessors, may include hundreds of pins in order to provide a complex electrical interface. However, regardless of the specific interface provided by the pins of an integrated circuit, the pins generally fall into a few, general categories. A number of the pins, such as pin 202 in FIG. 2, are used to input an operating voltage and/or current into the device. Other pins, such as pin 204 in FIG. 2, are interconnected to ground. The majority of the pins carry voltage and/or current signals. For example, the group of pins 206 in FIG. 2 each carry voltage signals representing an individual bit of a 16-bit data bus. Additional pins input or output signals from and to signal lines. For example, one important input signal is a periodic clock signal input from a system clock to the CLK pin 208. Another important input signal is the RESET signal input to the RESET pin 210. When the reset line is asserted, a microprocessor generally discontinues current operations and reinitializes itself.

Figure 3:
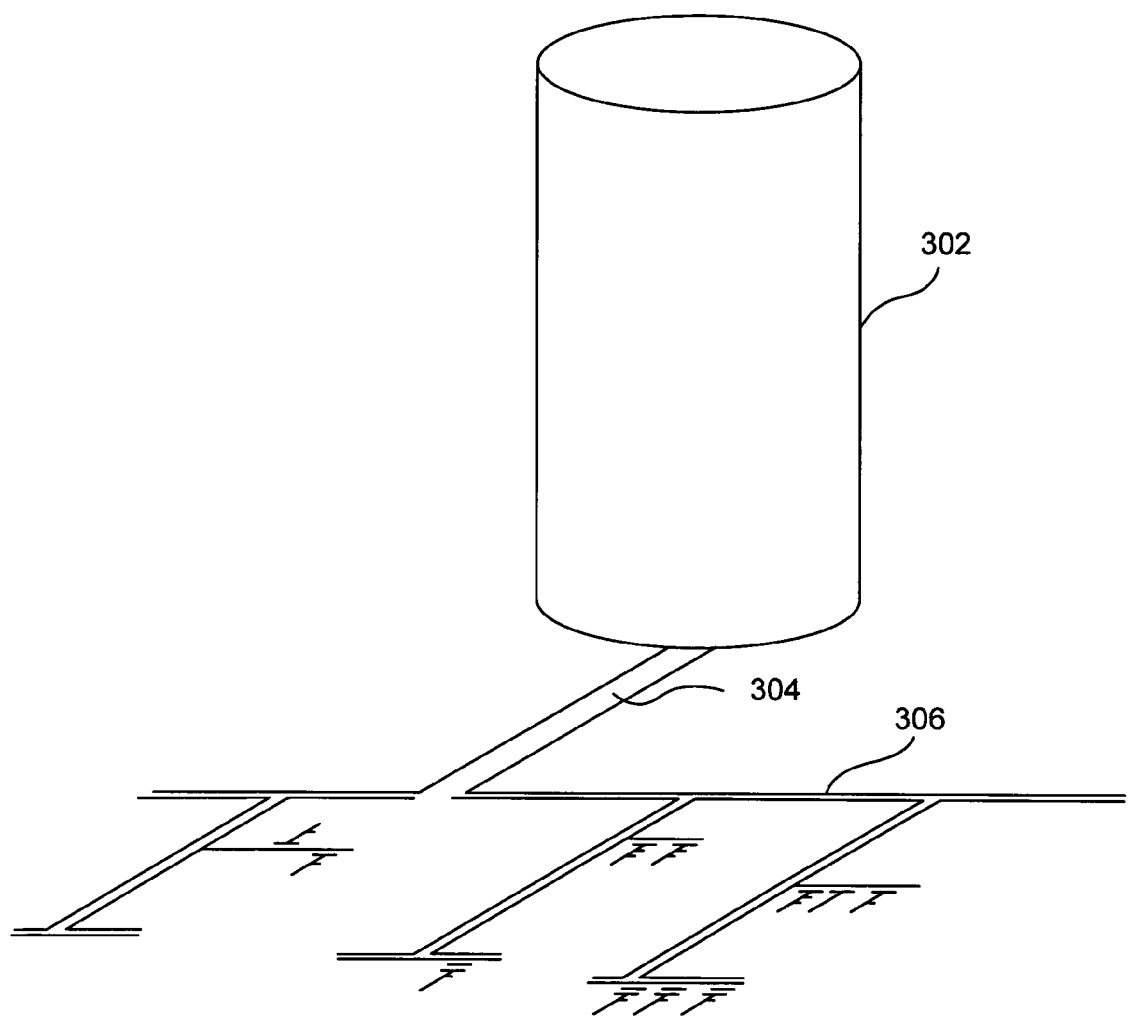
FIG. 3 shows the interconnection of an external pin of an integrated circuit with circuitry within an integrated circuit.

FIG. 3 shows the interconnection of an external pin of an integrated circuit with circuitry within an integrated circuit. As shown in FIG. 3, the pin 302 is normally affixed within the integrated circuit to extend away from the surface of the integrated circuit in a generally perpendicular direction. The pin is normally a rigid, metallic cylinder, and is electrically interconnected with one or more metallic signal lines 304 within the integrated circuit. Normally, the internal circuitry is covered with a ceramic or other mechanically rigid, insulating layer to protect it from mechanical and electrical damage. The one or more signal lines lead to additional signal lines, such as signal line 306, which in turn lead to various different internal electrical logic modules and components, including diodes, capacitors, and transistors.

Figure 4:
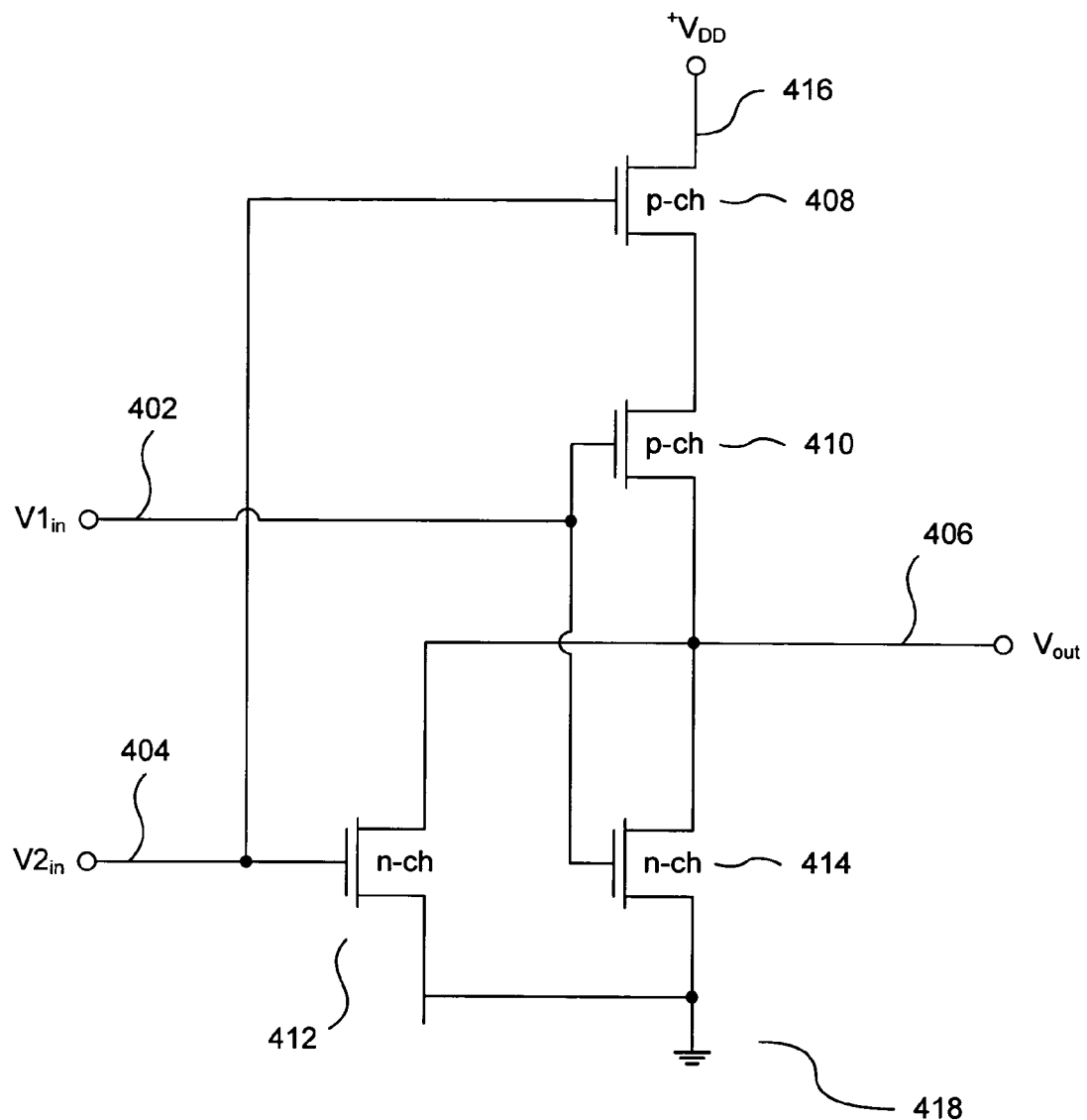
FIG. 4 shows a simple NOR gate in a complementary metal-oxide semiconductor ("CMOS") integrated circuit.

Although the internal structure of integrated circuits is extremely complex, the internal structure can be logically understood as a hierarchy of interconnected modules and components, each made up of various types and levels of sub-modules, each in turn made up of logic circuits constructed from basic logic gates. FIG. 4 shows a simple NOR gate in a complementary metal-oxide semiconductor ("CMOS") integrated circuit. The NOR logic gate receives two input signals 402 and 404 and produces a single output signal 406. Each of the input signal lines 402 and 404 can have one of two stable voltage states. A high-voltage state, generally on the order of two to five volts, represents the Boolean logic value "1," and a low-voltage state, generally below one volt, represents the Boolean logic value "0," although an opposite convention may also be used. When both inputs to a NOR gate are low, or not asserted, the output is high. Otherwise, the output is low. The CMOS NOR gate is composed of two p-channel transistors 408 and 410 and two n-channel transistors 412 and 414. The two p-channel transistors 408 and 410 serve as variable resistors in the CMOS NOR gate. When both input signals are low, or not asserted, neither of the two n-channel transistors 412 and 414 passes voltage. In other words, both n-channel transistors are equivalent to open switches. In this case, there is no path from the operational voltage input 416 to ground 418, and the voltage of the output signal line 406 is therefore equal to the input operational voltage. However, if one or both of the input signal lines 402 and 404 is asserted, or in a high-voltage state, then one or both of the n-channel transistors 412 and 414 is conductive, or equivalent to a closed switch, thereby connecting the input, operational voltage 416 to ground 418. In this case, the output voltage 406 is pulled towards 0 V. The CMOS NOR gate, shown in FIG. 4, is but one example of a number of different types of logic gates, including NAND and NOT gates, from which logic circuits, logic sub-modules, and modules are built within an integrated circuit.

Figure 5:
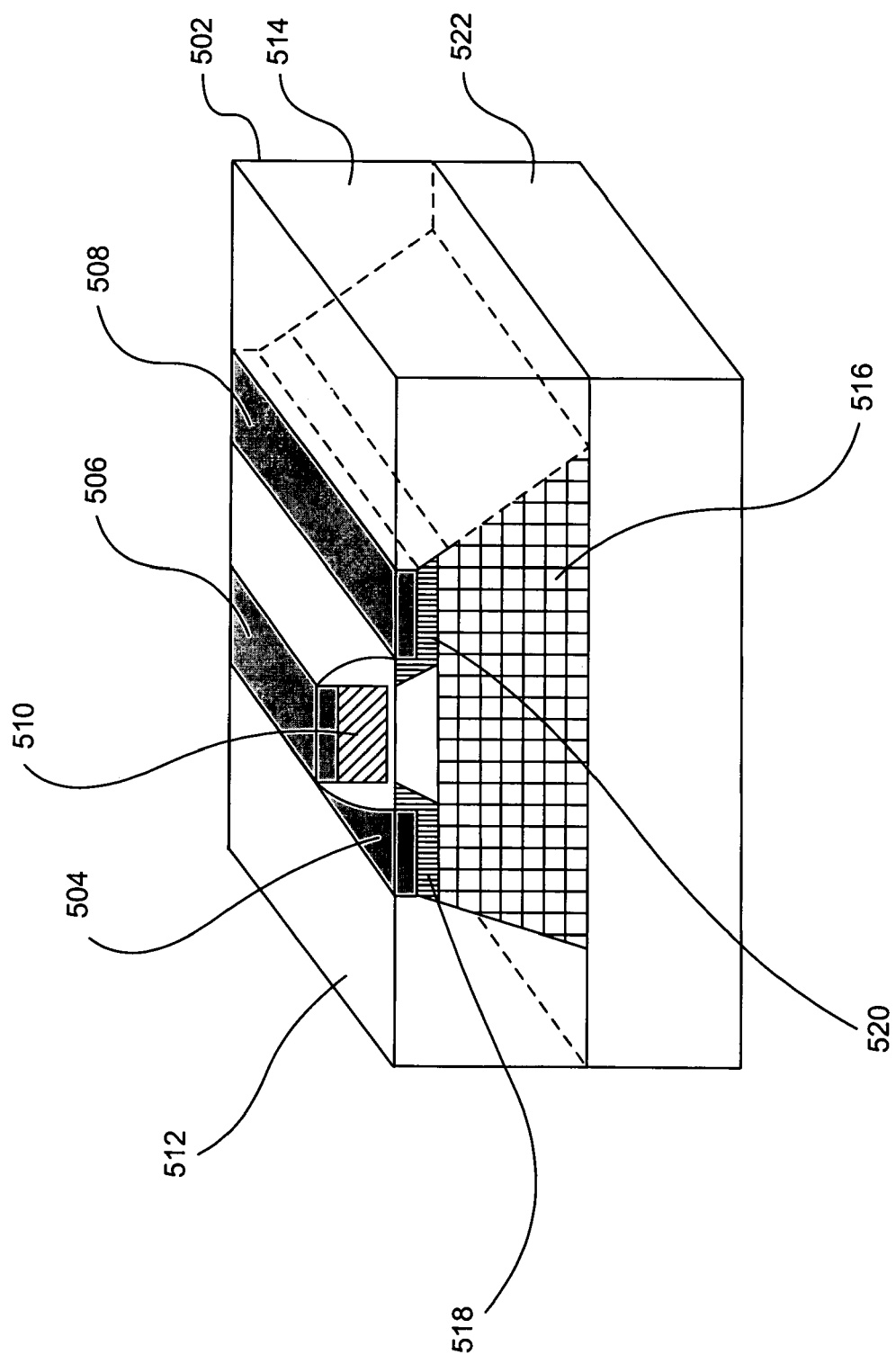
FIG. 5 shows the structure of one type of transistor, a metal-oxide-semiconductor field-effect-transistor ("MOSFET"), within an integrated circuit.

FIG. 5 shows the structure of one type of transistor, a metal-oxide-semiconductor field-effect-transistor ("MOSFET"), within an integrated circuit. FIG. 5 shows a small portion 502 of several layers of an integrated circuit in which an n-channel MOSFET has been fabricated. The n-channel MOSFET includes three conductive strips representing the source 504, gate 506, and drain 508 of the transistor. Below the gate is a rectangular block 510 of polysilicon. The uncolored portions of the MOSFET, such as the large flanking volumes 512 and 514, are silicon dioxide, a dielectric material that serves as an insulator. The large region 516 below the source, gate, and drain is p-doped silicon, and the smaller, shaded volumes 518 and 520 directly below the source 504 and drain 508, respectively, are n-doped silicon. The MOSFET is fashioned on top of a substrate layer 522, generally silicon dioxide, amorphous silicon, or another substrate.

Figure 7A:
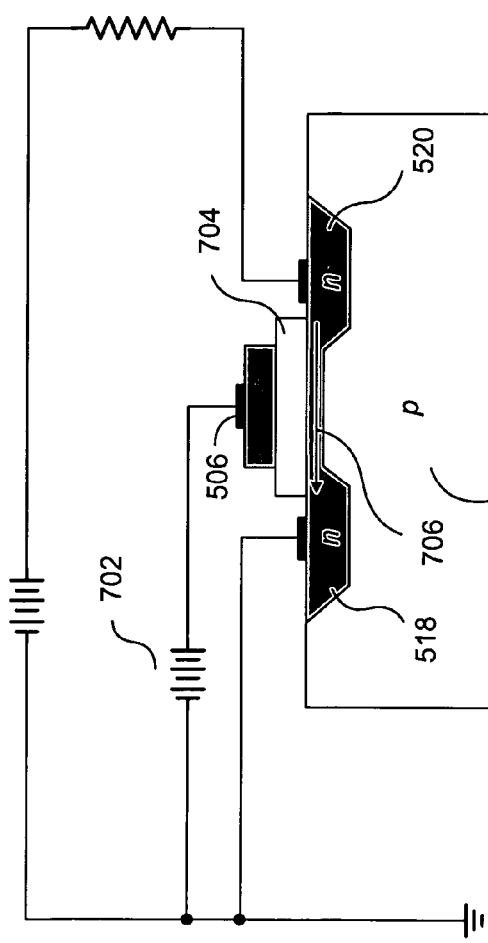
Figure 7B:
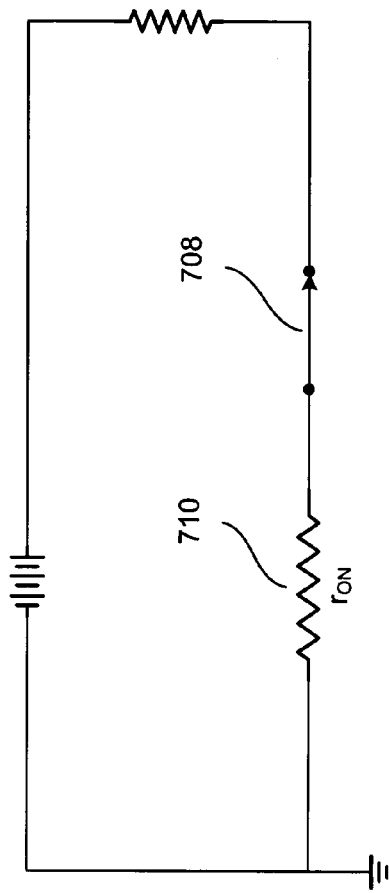

FIGS. 6A-7B illustrate operation of the MOSFET shown in FIG. 5. In FIGS. 6A and 7A, the MOSFET is schematically depicted in a two-dimensional cross-section, and is included in a simple electrical circuit. FIGS. 6B and 7B show equivalent circuits for the MOSFET-containing circuits shown in FIGS. 6A and 7A, respectively. In FIG. 6A, both the gate 506 and the source 504 of the MOSFET 602 are connected to ground 604. In this case, the MOSFET is not conducting, and does not provide a conductive path between the drain 508 and the source 504. Therefore, despite the presence of a voltage source 606 in the simple circuit shown in FIG. 6A, no current flows. In other words, as shown in FIG. 6B, the MOSFET is equivalent to an open switch 608. By contrast, when the voltage of the gate 506 is raised, as shown in FIG. 7A by a second voltage source 702 connected to the gate 506, the channel 704 between the gate 506 and the p-doped silicon 516 functions as a capacitor, with a negative charge buildup within the p-doped silicon at the interface between the p-doped silicon layer and the channel 704. This results in formation of a temporary conductive channel 706 equivalent in conductivity to n-doped silicon between the two n-doped silicon volumes below the source 518 and the drain 520, allowing current to pass. Thus, as shown in FIG. 7B, when voltage is applied to the gate 506, the MOSFET functions as a closed switch 708. Note that the MOSFET is associated with a small internal resistance $r_{ON}$ 710.

Figure 8A:
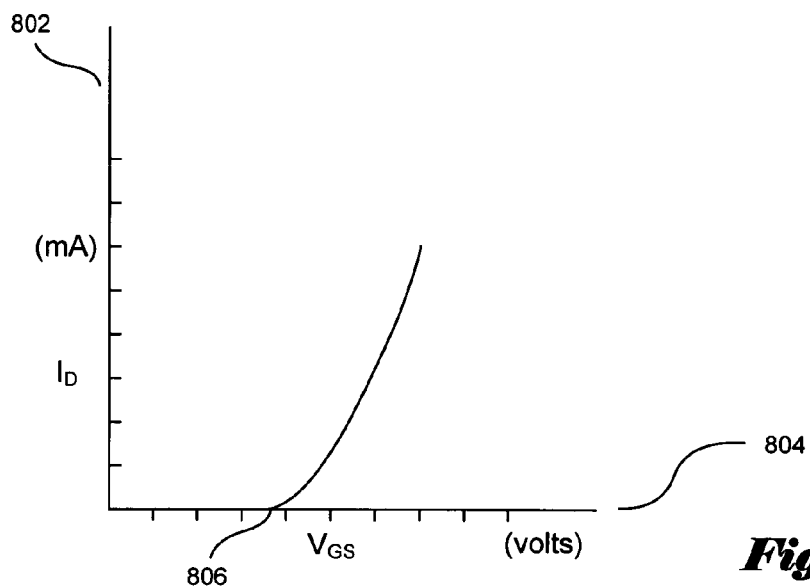
FIGS. 8A-C illustrate the electronic characteristics of the MOSFET discussed above with reference to FIGS. 5-7B.
Figure 8B:
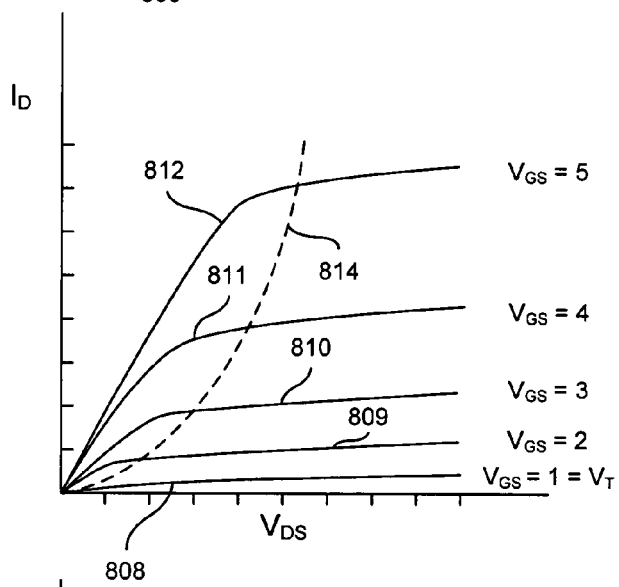
Figure 8C:
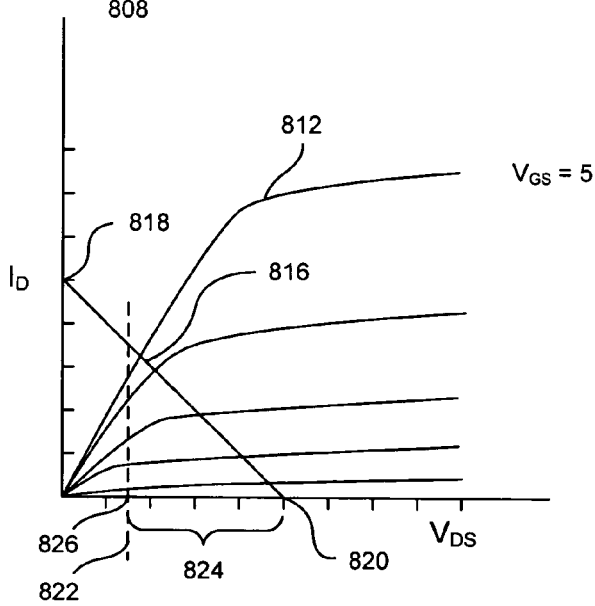

Operation of the n-channel MOSFET, discussed above with reference to FIGS. 5-7B, can be easily visualized by graphical plots of drain current versus the voltage applied to the gate and to the drain. FIGS. 8A-C illustrate the electronic characteristics of the MOSFET discussed above with reference to FIGS. 5-7B. FIG. 8A shows the relationship between the drain current, $I_D$, plotted along the y axis 802 and the voltage, $V_{GS}$, applied to the gate of the MOSFET, plotted along the x axis 804. As shown in FIG. 8A, the drain current is essentially zero volts until the voltage applied to the MOSFET gate, $V_{GS}$, reaches a threshold voltage $V_T$ 806, following which the drain current $I_D$ increases rapidly with increasing voltage applied to the MOSFET gate.

FIG. 8B shows the relationship between drain current $I_D$ and the voltage potential between the drain and source of the MOSFET, $V_{DS}$. FIG. 8B shows a family of curves 808-812, each curve showing the relationship between drain current, $I_D$, and the voltage across the drain and source, $V_{DS}$, at different constant voltages applied to the MOSFET gate, $V_{GS}$. As shown in FIG. 8B, when the voltage applied to the MOSFET gate $V_{GS}$ is significantly above the threshold voltage $V_T$, the drain current $I_D$ rises steeply with increasing voltage across the MOSFET, and then levels off to a relatively constant drain current ID. The portion of the curves to the left of the curved, dashed line 814 is considered the ohmic portion of MOSFET operation, and represents the conditions under which a MOSFET is operated in logic circuits, where MOSFETs are used as switches.

FIG. 8C shows a load line superimposed over the drain-current/drain-source-voltage curves shown in FIG. 8B. The load line 816, is a graphical device used to compute the drain voltages corresponding to Boolean "1" and Boolean "0" states. The left end point of the load line 818 corresponds to the drain current $I_D$ that would theoretically be observed when the MOSFET is in a closed state, with no internal resistance. The right end point of the load line 820 is the voltage between the drain and source of the MOSFET when the MOSFET is an open state. The voltage between the drain and source of the MOSFET when the MOSFET is in closed state induced by application of a particular voltage to the MOSFET gate, $V_{GS}$, is obtained by dropping a line 822 perpendicular to the y axis from the intersection of the load line 816 and the current/voltage curve 812 for the particular gate voltage, $V_{GS}$. Thus, the margin between the low and high, or Boolean "0" and Boolean "1," voltages between the MOSFET drain and source is the range 824 between the closed-MOSFET drain-to-source voltage 826 and the open-MOSFET drain-to-source voltage 820.

The mathematical relationship between the drain current $I_D$, the voltage applied to the gate of the MOSFET, $V_{GS}$, the threshold voltage $V_T$, and the drain-to-source voltage across the MOSFET, $V_{DS}$, can be approximated as:

$$I_D = K/2(V_{GS}-V_T)V_{DS}-V_{DS}^2]$$

when MOSFET is operated within the ohmic operational range, with:

$$|V_{DS}| < |V_{GS}-V_T|$$

Figure 9:
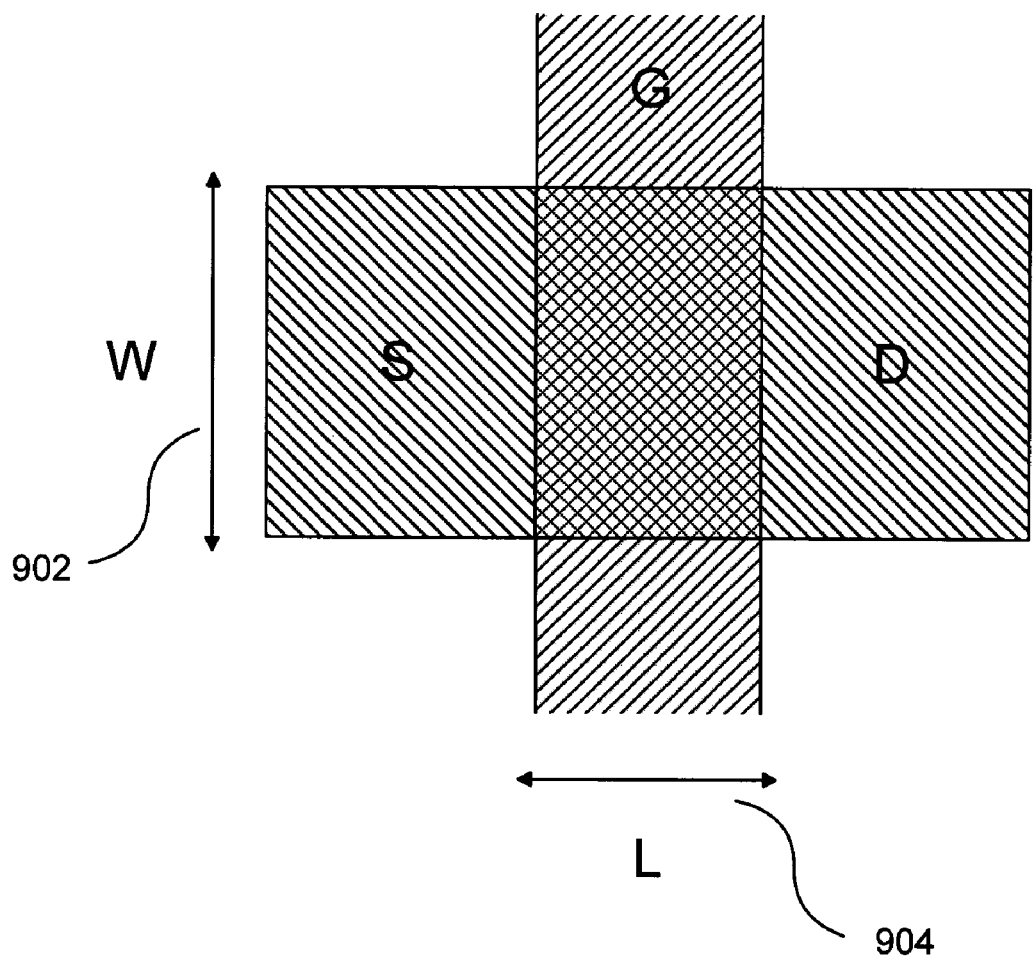
FIG. 9 shows a simplified, schematic representation of the source, gate, and drain regions of an n-channel MOSFET, such as the n-channel MOSFET shown in FIG. 5, looking down on the MOSFET from above.

The constant K, as well as the internal resistance of the MOSFET, $r_{ON}$, is dependent on the physical characteristics of the MOSFET. FIG. 9 shows a simplified, schematic representation of the source, gate, and drain regions of an n-channel MOSFET, such as the n-channel MOSFET shown in FIG. 5, looking down on the MOSFET from above. Two important parameters of a MOSFET are the width (902 in FIG. 9), W, of the MOSFET and the length (904 in FIG. 9), L, of the channel separating the source and the drain. The constant K, for example, is proportional to W/L. The shape of the drain-current/drain-to-source voltage curves shown in FIGS. 8B and C can thus be markedly altered by changing the physical characteristics of the MOSFET from which the curves are generated. Many other additional physical parameters of a MOSFET affect its operational characteristics, including the concentration of n and p dopants in the silicon substrate, the thickness of the silicon dioxide channel separating the gate from the p-doped silicon substrate, the uniformity and thickness of the conductive gate, source, and drain elements, and many other parameters.

Figure 10:
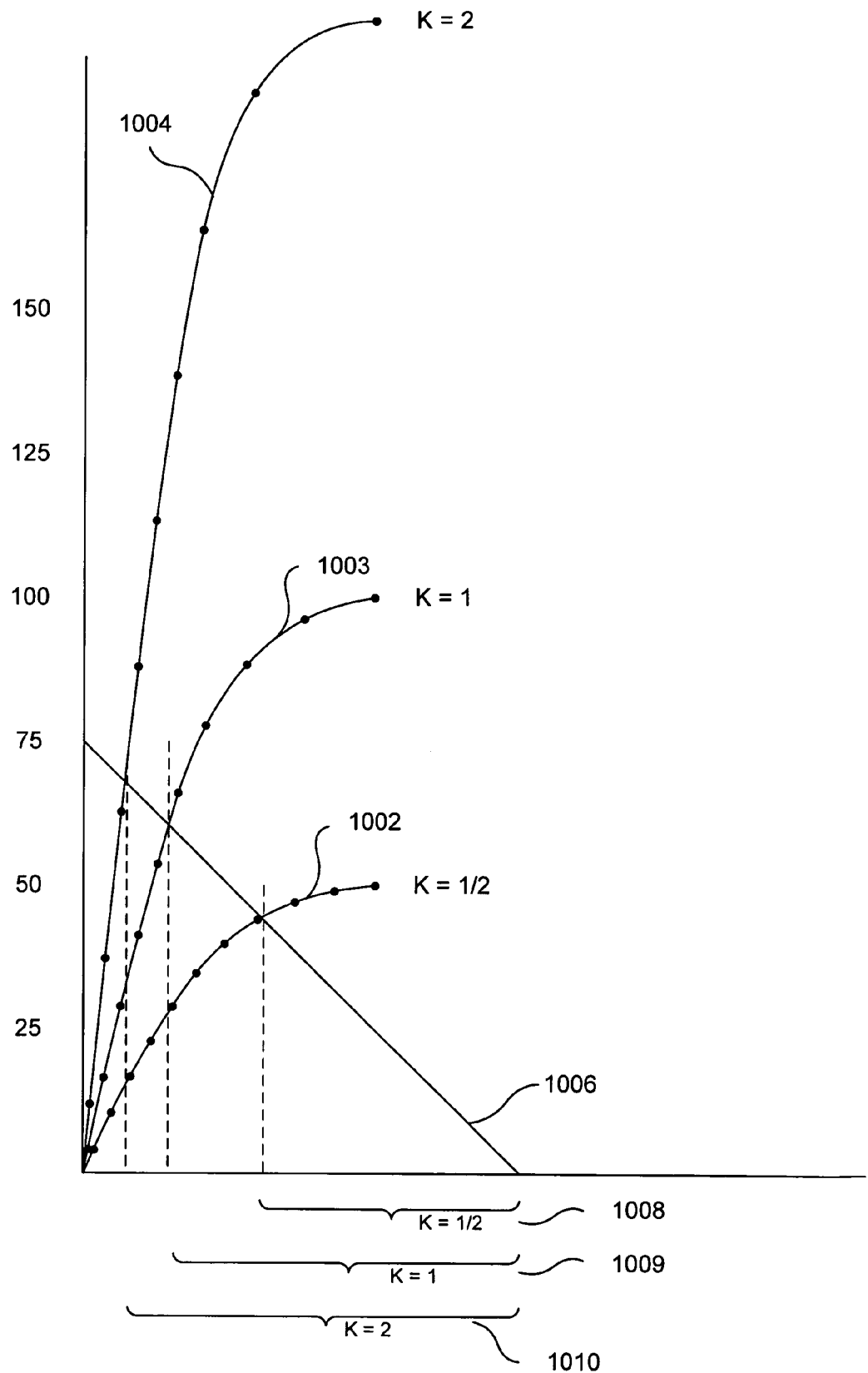
FIG. 10 illustrates the effects on hypothetical drain-current/drain-to-source-voltage curves for a MOSFET that result from altering the value of the constant K through changes to physical characteristics of the MOSFET.

FIG. 10 illustrates the effects on hypothetical drain-current/drain-to-source-voltage curves for a MOSFET that result from altering the value of the constant K through changes to physical characteristics of the MOSFET. FIG. 10 shows three different curves computed from the relationship:

$$I_D = K(20x-x^2)$$

with K=½, 1, and 2, respectively. FIG. 10 also shows a hypothetical load line 1006 superimposed over the three curves 1002-1004. As can be seen by the voltage margins 1008-1010 graphically constructed below the x axis for the K=½, K=1, and K=2 curves, the operational voltage margin between Boolean "0" and Boolean value "1" may be significantly changed by changes in the value of the constant K. This explains how even slight deviations or defects in the manufacturing of an integrated circuit may severely impact the operational characteristics of any given component, such as a MOSFET, within the integrated circuit. However, comparing FIG. 10 with FIGS. 8B and 8C, it is apparent that the three different curves, K=½, K=1, and K=2 in FIG. 10 appear to be related in the same way that the family of curves in FIGS. 8B and 8C are related. In other words, were one able to alter, or tune, the voltage applied to the gate of the MOSFET, a MOSFET with a particular drain-current/drain-to-source-voltage curve can be transformed into a MOSFET with a different drain-current/drain-to-source-voltage current originally desired for the MOSFET.

Figure 11:
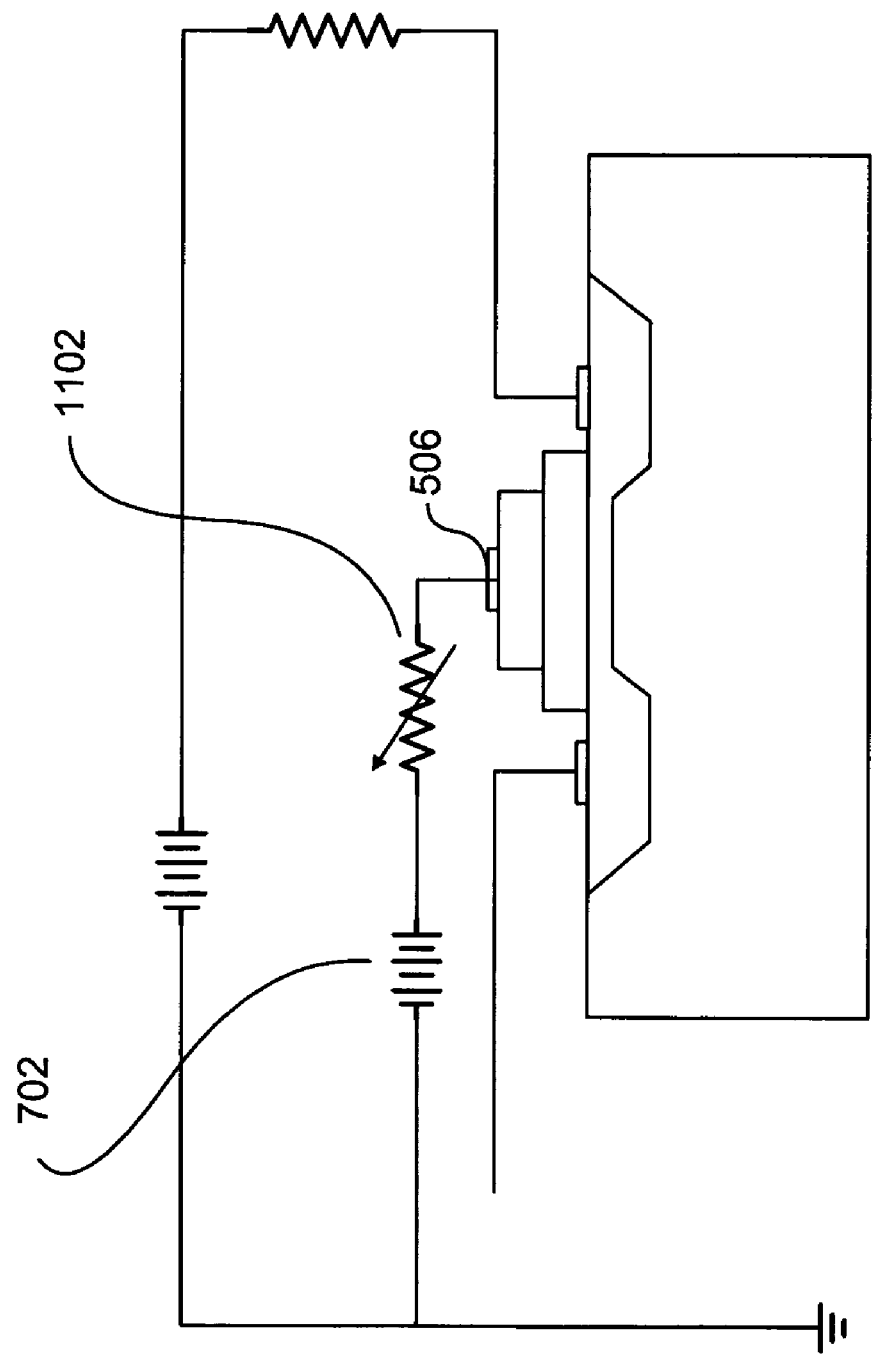
FIG. 11 illustrates one concept underlying embodiments of the present invention.

FIG. 11 illustrates one concept underlying embodiments of the present invention. FIG. 11 uses the same illustration conventions as used in FIGS. 6A and 7A. However, in the circuit shown in FIG. 11, a tunable, variable resistor 1102 has been added between the second voltage source 702 and the MOSFET gate 506. By adjusting the resistance of the variable resistor, the MOSFET can be tuned to have a particular, desired drain-current/drain-to-source-voltage curve. In other words, by tuning the variable resistor 1102, any of the family of curves shown in FIG. 10 can be obtained.

Figure 12:
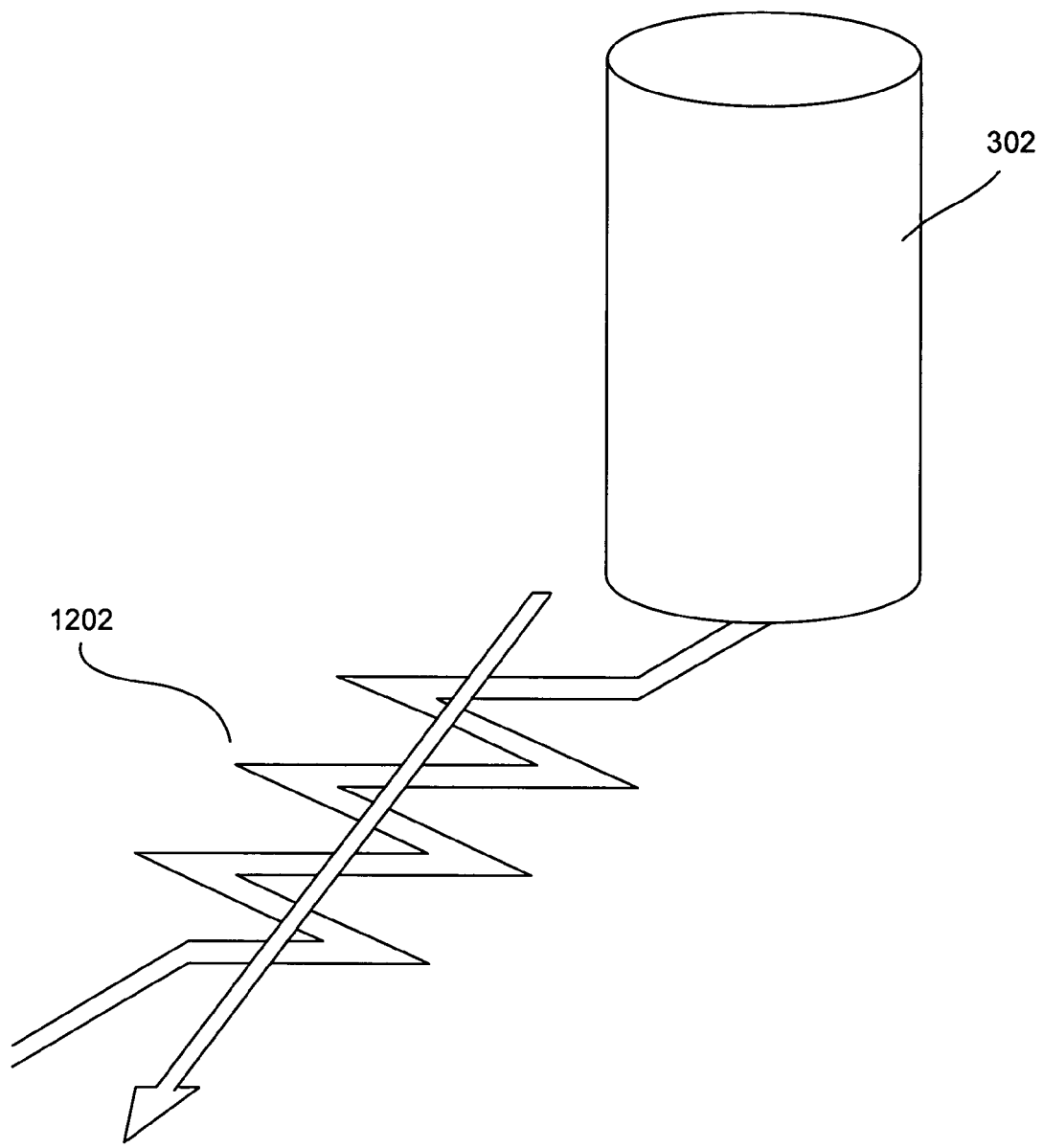
FIG. 12 schematically illustrates an underlying concept of numerous embodiments of the present invention.

FIG. 12 schematically illustrates an underlying concept of numerous embodiments of the present invention. FIG. 12 employs similar illustration conventions to those employed in FIG. 3. Note, however, that a tunable, variable resistor 1202 is introduced in the signal line leading from the pin 302 into the internal circuitry of the integrated circuit. In various embodiments of the present invention, tunable resistors are fabricated into the interconnection layer, between the pin and internal circuitry of the integrated circuits, to provide an ability to tune input voltages and currents to the integrated circuit. In other embodiments, the tunable resistors are fabricated in the packaging component. Tunable resistors represent one type of tunable component that may be introduced to provide post-manufacturing configuration and defect amelioration. Other types of tunable electronic components that provide control of internal signal-line voltages and currents can also be used. For configuration, the tunable components are used as switches, while for defect amelioration, the tunable components may either be used as switches or to adjust the electrical properties of defective components in order to bring them back within specified ranges or tolerances.

Tunable resistors can be fabricated from conductive polymers with resistivities that reflect the prior exposure of the materials to relatively high voltages or currents. One exemplary material is organic-polymer film consisting of the two-component, conductive polymer mixture poly(3,4-ethylenedioxythiophene) and poly(styrene sulfonate) ("PEDT/PSS"), known by the trade name "Baytron® P." Many other organic and inorganic compounds may exhibit electrical properties dependent on histories of exposure to voltage and current, and may therefore be suitable for fabrication of tunable resistors. Alternatively, various types of doped silicon used for fabricating transistors may allow the transistors to be used as tunable, variable resistors. Application of relatively large positive or negative voltages can, for example, increase or decrease the resistivity of certain types of resistor materials, allowing the resistance level of tunable resistors to be modified following manufacture of an integrated circuit of packaging component. Voltage pulses or current pulses may be applied to one or a combination of external pins or contacts in order to modify the resistance of a tunable resistor within a defect-resistant or configurable integrated circuit that represents an embodiment of the present invention.

Tunable components within an integrated circuit may provide various levels and granularities of adjustment and switching. For example, tunable components may be introduced at multiple logical levels within the integrated circuit, with tuning of higher levels influencing the ability to more finely tune internal components at lower levels. The resistances or other electrical characteristics of the tunable components may be tabulated in matrices and manipulated by well-known optimization techniques to achieve desired tunings by tuning individual components. In fact, such optimization techniques may allow for largely automated tuning of individual integrated circuits to pre-determined specifications under specified constraints.

Although the present invention has been described in terms of a particular embodiment, it is not intended that the invention be limited to this embodiment. Modifications within the spirit of the invention will be apparent to those skilled in the art. For example, as discussed above, any of numerous tunable electronic components may be included in an integrated circuit or in a packaging component to provide tenability and configurability to various levels of logic and components within the integrated circuit, including individual electronic components, such as transistors, logic gates, logic modules and subsystems, and other levels of circuitry. Voltage levels, current levels, and possible other characteristics within the integrated circuit are modified by tuning to bring defective components back into specified operational ranges and to switch off, or to switch on, logic modules and components.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Obviously many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A defect-resistant digital integrated circuit comprising:
   internal circuits composed of internal signal lines and internal electronic components;
   external conductive pins or contacts for carrying voltage, voltage reference, and signals into and out from the internal circuits; and
   tunable components that interconnect the external conductive pins or contacts with the internal circuits that, when tuned, following manufacture of the defect resistant integrated circuit, adjust voltage levels that encode digital signals within the internal circuits in order to ameliorate defectively operating internal electronic components.

2. The defect-resistant integrated circuit of claim 1 wherein the tunable components are tunable resistors.

3. The defect-resistant integrated circuit of claim 1 wherein the tunable components are tuned by supplying voltage or current pulses to one or more of the external conductive pins or contacts.

4. The defect-resistant integrated circuit of claim 1 wherein tuning of one or more tunable components provides for changing the electronic characteristics of one or more of:
   internal electronic components, including transistors;
   internal logic gates; and
   internal logic modules and subsystems.

5. The configurable integrated circuit of claim 1 wherein the tunable components are tunable resistors.

6. The configurable integrated circuit of claim 1 wherein the tunable components are tuned by supplying voltage or current pulses to one or more of the external conductive pins or contacts.

7. The configurable integrated circuit of claim 1 wherein tuning of one or more tunable components provides for switching on or switching off one or more of:
   internal electronic components, including transistors;
   internal logic gates; and
   internal logic modules and subsystems.

8. A configurable digital integrated circuit comprising:
   internal circuits composed of internal signal lines and internal electronic components;
   external conductive pins or contacts for carrying voltage, voltage reference, and signals into and out from the internal circuits; and
   tunable components that interconnect the external conductive pins or contacts with the internal circuits that, when tuned, following manufacture of the defect resistant integrated circuit, adjust voltage levels that encode digital signals within the internal circuits in order to configure the integrated circuit.

9. A packaging component that mates with a digital integrated circuit to mount the integrated circuit within a printed circuit board or other electronic system, the packaging component comprising:
   contact-containing receptacles for receiving external pins or contacts of an integrated circuit;
   conductive leads for interconnecting the packaging component and an integrated circuit mated to the packaging component to signal lines of the printed circuit board or other electronic system;
   internal signal lines that interconnect the contacts of the contact-containing receptacles to the conductive leads; and
   tunable electronic components that control voltages or currents of the internal signal lines in order to adjust voltage levels that encode digital signals within the integrated circuit in order to ameliorate defectively operating internal electronic components of the integrated circuit or to configure the integrated circuit.

10. The packaging component of claim 9 wherein the tunable components are tunable resistors.

11. The packaging component of claim 9 wherein the tunable components are tuned by supplying voltage or current pulses to one or more of the external leads.

* * * * *